US006996786B2

(12) United States Patent
Voldman

(10) Patent No.: US 6,996,786 B2
(45) Date of Patent: Feb. 7, 2006

(54) LATCH-UP ANALYSIS AND PARAMETER MODIFICATION

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 10/605,443

(22) Filed: Sep. 30, 2003

(65) Prior Publication Data

US 2005/0071789 A1    Mar. 31, 2005

(51) Int. Cl.
*G06F 17/50*    (2006.01)
(52) U.S. Cl. ......................................................... 716/2
(58) Field of Classification Search .................... 716/2, 716/8–11; 710/8; 257/360, 577; 438/268
See application file for complete search history.

(56) References Cited

U.S. PATENT DOCUMENTS

| | | | | |
|---|---|---|---|---|
| 5,982,021 A | * | 11/1999 | Verma | 257/577 |
| 6,165,848 A | * | 12/2000 | Thiemann | 438/268 |
| 6,329,692 B1 | * | 12/2001 | Smith | 257/360 |
| 6,553,542 B2 | * | 4/2003 | Ramaswamy et al. | 716/2 |
| 2003/0229730 A1 | * | 12/2003 | Pedrazzini et al. | 710/8 |

* cited by examiner

*Primary Examiner*—Vuthe Siek
(74) *Attorney, Agent, or Firm*—Richard A. Henkler; Hoffman, Warnick & D'Alessandro LLC

(57) ABSTRACT

A latch-up analysis and parameter modification system, method and program product that analyzes a circuit design for latch-up sensitivity and allows for modifications of the circuit design to avoid latch-up of the circuit while improving the density and overall performance of the circuit are disclosed. Latch-up of a circuit design is analyzed through identifying an injector source and a collector circuit, at least one of the injector source and the collector circuit having a parameter, providing latch-up criteria for the collector circuit, and determining latch-up sensitivity of the collector circuit based on the latch-up criteria and the parameter. Then, the parameter may be modified to adjust latch-up sensitivity, and latch-up sensitivity of the collector circuit is determined based on the latch-up criteria and the modified parameter.

17 Claims, 7 Drawing Sheets

LATCH-UP ANALYSIS AND PARAMETER MODIFICATION

BACKGROUND OF INVENTION

BACKGROUND OF THE INVENTION

1. Technical Field

The invention relates generally to integrated circuits and systems and more specifically to a latch-up analysis and circuit parameter modification system for an integrated circuit.

2. Related Art

As electronic components become smaller and smaller along with the internal structures in integrated circuits, it is easier to either completely destroy or otherwise impair electronic components and circuits through latch-up. In advanced CMOS technologies, latch-up can occur in any sector of a semiconductor chip. Latch-up can occur from both current and voltage perturbations to the semiconductor chip, especially at the terminals or in the substrate or well regions of the semiconductor chip. Since latch-up typically occurs within a pnpn structure, which may be intentionally designed, or unintentionally formed between structures, the latched circuit is typically a pnpn structure. Hence, the latched circuit may include peripheral circuits or internal circuits, and may be one circuit or multiple circuits.

Specifically within a circuit, latch-up is typically initiated by a cross-coupled pnp and npn transistor. With the base and collector regions being cross-coupled, current flows from one device leading to the initiation of the second (regenerative feedback). These cross-coupled pnp and npn elements can be any diffusions or implanted regions of other circuit elements (e.g., p-channel MOSFETs, n-channel MOSFETs, resistors, etc.) or actual pnp and npn bipolar transistors. In CMOS, these can be formed from MOSFET elements. In CMOS, the pnpn structure can be formed with any p-diffusion in a n-well, and any n-diffusion in a p-substrate whereas the p-diffusion may be a diffusion of a p-channel MOSFET, and the n-diffusion may be a n-channel MOSFET. In this case, the well and substrate regions are inherently involved in the latch-up current exchange between regions.

The condition for triggering a latch-up is a function of the current gain of the pnp and npn transistors, and the parasitic resistance between the emitter and the base regions. This condition inherently involves the well and substrate regions. The sensitivity of a particular pnpn structure to latch-up is a function of spacings (e.g., the base width of the npn and the base width of the pnp), current gain of the transistors, substrate resistance and spacing, the well resistance and spacings, emitter resistance and isolation regions. In the case that current or voltage from an injecting source triggers a latch-up in a circuit, the pnpn structure transitions from a low-current/high-voltage state to a high-current/low-voltage state.

The injecting condition can occur at the terminals, or inherently within the bulk semiconductor. Latch-up can be induced by voltage or current perturbations on the power rails, input pins or any pin of a semiconductor chip. Latch-up can occur from noise. Latch-up can also occur from single event upsets (SEU) from, for example, alpha-particles, and cosmic rays (e.g., neutrons, protons, gamma radiation, and other terrestrial particles).

Currently, there are several different design systems that allow for a variety of design work, but unfortunately none of these systems allow for the analyzing of a circuit design for latch-up sensitivity. Consequently, they do not allow for the modification of the circuit design to alter latch-up sensitivity.

Accordingly, a need has developed in the art for a system and method that analyzes a circuit design for latch-up sensitivity and allows for modifications of the circuit design to alter latch-up sensitivity of a circuit while improving the density and overall performance of the circuit.

SUMMARY OF INVENTION

The present invention provides a latch-up analysis and parameter modification system, method and program product that analyzes a circuit design for latch-up sensitivity and allows for modifications of the circuit design to alter latch-up sensitivity of a circuit while improving the density and overall performance of the circuit.

Generally, a first aspect of the present invention is directed to a method comprising the steps of: identifying an injector source and a collector circuit, at least one of the injector source and the collector circuit having a parameter; providing latch-up criteria for the collector circuit; determining latch-up sensitivity of the collector circuit based on the latch-up criteria and the parameter; modifying the parameter to adjust the latch-up sensitivity of the collector circuit; and determining the latch-up sensitivity of the collector circuit based on the latch-up criteria and the modified parameter.

In addition, a second aspect of the present invention provides a computer program product comprising: program code configured to identify an injector source and a collector circuit, at least one of the injector source and the collector circuit having a parameter; program code configured to determine latch-up sensitivity of the collector circuit based on a latch-up criteria and the parameter; and program code configured to modify the parameter to adjust the latch-up sensitivity of the collector, wherein the determining program code is also configured to determine the latch-up sensitivity of the collector circuit based on the latch-up criteria and the modified parameter.

The present invention also provides a system comprising: an injector source and collector circuit identifier that identifies an injector source and a collector circuit, at least one of the injector source and the collector circuit having a parameter; a latch-up identifier providing latch-up criteria for the collector circuit; a parameter modification unit to modify the parameter; and a latch-up analyzer that determines latch-up sensitivity of the collector circuit based on the latch-up criteria of the latch-up identifier and at least one of the parameter and the modified parameter.

The foregoing and other features of the invention will be apparent from the following more particular description of embodiments of the invention, as illustrated in the accompanying drawings.

BRIEF DESCRIPTION OF DRAWINGS

Embodiments of the present invention will hereinafter be described in conjunction with the appended drawings, where like designations denote like elements, and wherein.

DETAILED DESCRIPTION

Figure 1:
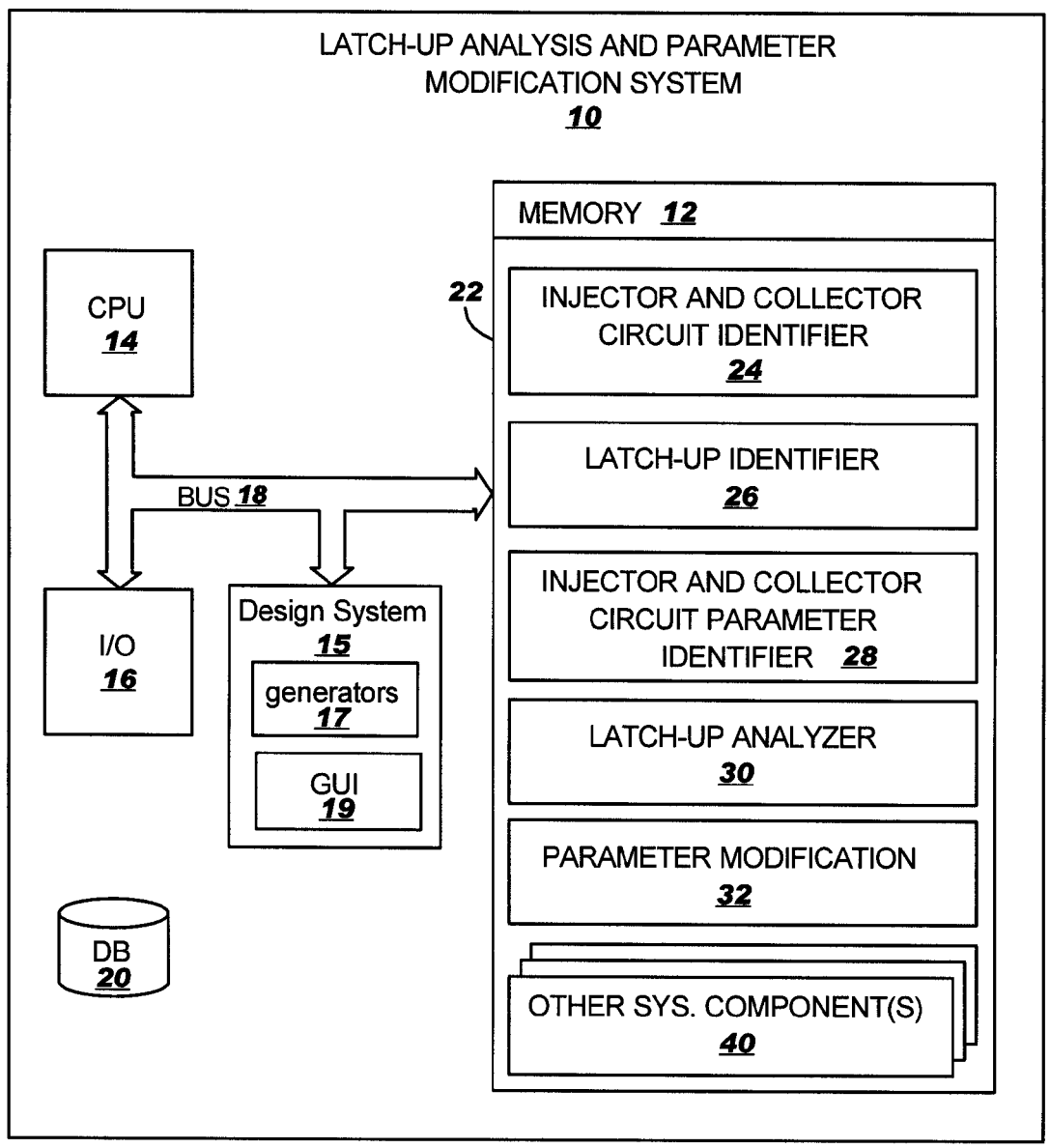
FIG. 1 is a block diagram illustrating a latch-up analysis and parameter modification system in accordance with the present invention.

With reference to the accompanying drawings, FIG. 1 is a block diagram of a latch-up analysis and parameter modification system 10 in accordance with the invention. Latch-up analysis and parameter modification system 10 includes a memory 12, a central processing unit (CPU) 14, a design system 15, input/output devices (I/O) 16 and a bus 18. A database 20 may also be provided for storage of data relative to processing tasks. Memory 12 includes a program product 22 that, when executed by CPU 14, comprises various functional capabilities described in further detail below. Memory 12 (and database 20) may comprise any known type of data storage system and/or transmission media, including magnetic media, optical media, random access memory (RAM), read only memory (ROM), a data object, etc. Moreover, memory 12 (and database 20) may reside at a single physical location comprising one or more types of data storage, or be distributed across a plurality of physical systems. CPU 14 may likewise comprise a single processing unit, or a plurality of processing units distributed across one or more locations.

Design system 15 includes generators 17 and a graphical user interface (GUI) 19. Design system 15 may represent one specific design system, such as a Cadence™ design system, or several different design systems and environments. Generators 17 may include any known type of design generator or combination of design generators, such as a graphical generator, a schematic generator, and/or a symbolic generator. Generators 17 typically are used to form circuit representations. That is, a graphical generator identifies a circuit element, circuit or a plurality of circuits through shape manipulation and shape definition. A schematic generator develops a schematic representation of the circuit, and a symbol generator develops a symbolic representation of the circuit. In many design systems, graphical designs are generated by shapes of masks, and their orientation and intersection. For example, a graphical representation of a MOSFET is formed by the intersection of an isolation rectangle and a gate rectangle. A schematic representation of a MOSFET is identified as a MOSFET transistor symbol. GUI 19 is used to modify the design and make the design choices in the system, as is known for conventional design systems.

As one specific example, this system may be integrated with a Cadence design environment. In a Cadence environment, graphical, schematic and symbolic representations are known as cellviews. These elements are constructed from parameterized cell (Pcell) structures. These Pcells are modified, using GUI 19, to a constrained set of design parameters. Hierarchical circuits are formed through the design environment, where parameters are passed to the higher-order circuit elements, which themselves become Pcells after compilation, known as hierarchical Pcells. In this environment, circuit elements and spatial entities are identified by system 10 from Pcells, which store the spatial, shapes, and circuit information.

I/O 16 may comprise any known type of input/output device including graphical drivers, a network system, modem, keyboard, mouse, scanner, voice recognition system, CRT, printer, disc drives, etc. Additional components, such as cache memory, communication systems, system software, etc., may also be incorporated into system 10.

As shown in FIG. 1, program product 22 may include an injector source and collector circuit identifier 24, a latch-up identifier 26, injector source and collector circuit parameter identifier 28, a latch-up analyzer 30, a parameter modification unit 32, and other system components 40. Injector source and collector circuit identifier 24, injector source and collector circuit parameter identifier 28, and latch-up identifier 26 store both spatial information, electrical information and latch-up-related information. As aforementioned, this information may be stored and identified through graphical, schematic and symbol generators 17. Specifically for the Cadence design system, the information stored would be stored in Pcells. Injector source and collector circuit parameter identifier 28 and parameter modification unit 32 may use GUI 19 for optimization of the semiconductor design. One embodiment of an operational method of program product 22 and system 10 will be discussed in greater detail in reference to FIGS. 5A, 5B and 5C.

Figure 2:
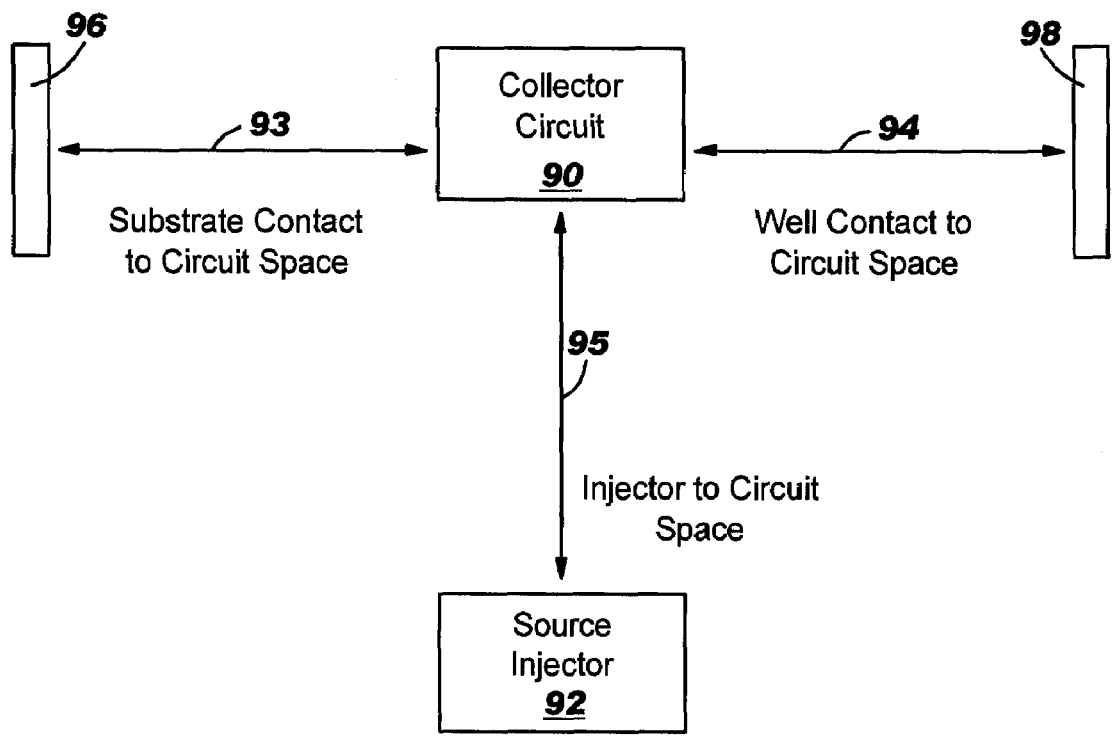
FIG. 2 is a block diagram of an example of an injector source and collector circuit that may be used with the system of FIG. 1.

FIG. 2 is a block diagram of an example of an injector source 92 and collector circuit 90 that may be analyzed with system 10 (FIG. 1). The design level of injector source 92 may be a virtual design level or an actual design level. The design level of collector circuit 90 may also be a virtual design level or an actual design level. Injector source 92 is a source that may unintentionally activate a circuit, such as collector circuit 90, resulting in latch-up of the circuit. Injector source 92 may or may not be an actual circuit but may serve as a generator of current or voltage perturbations. In the case of single event upsets (SEU), injector source 92 may be a representative current source of minority carriers representing a current magnitude and physical location within a semiconductor chip. Injector source 92 may be part of collector circuit 90, or may be outside collector circuit 90. Injector source 92 may also be a circuit that is able to be modified (as will be discussed below), such as an electrostatic discharge (ESD) circuit, or may be a source, such as a gamma ray, an alpha particle, ionizing radiation, a minority carrier or a cosmic ray, that is not modifiable. Collector circuit 90 includes any circuit that is affected by injector source 92. The spatial extent of injector source 92 may be localized to a given circuit element, to a given circuit, or to a segment or power domain of a chip (e.g., local VDD). The spatial extent may also be distributed to a region of space, distributed across an entire semiconductor chip or plurality of semiconductor chips, or distributed across a computer system, plurality of systems, or a network.

Elements 96 and 98 represent the substrate contact and well contact of collector circuit 90, respectively. The space between collector circuit 90 and injector source 92 is indicated by line 95. The substrate contact 96 to collector circuit 90 space is indicated by line 93 and the well contact 98 to collector circuit 90 space is indicated by line 94. In a Cadence design environment, substrate contact 96 and well contact 98 may or may not be contained within the Pcell of collector circuit 90. In the case of where substrate contact 96 and well contact 98 are part of the Pcell of collector circuit 90, the Pcells can be a design parameter in GUI 19 (FIG. 1) and can be an inherited parameter to a hierarchical Pcell. Although specific reference is made to a Cadence design system, it is to be understood that other similar design systems may be used and the present invention is not limited to such.

Figure 3:
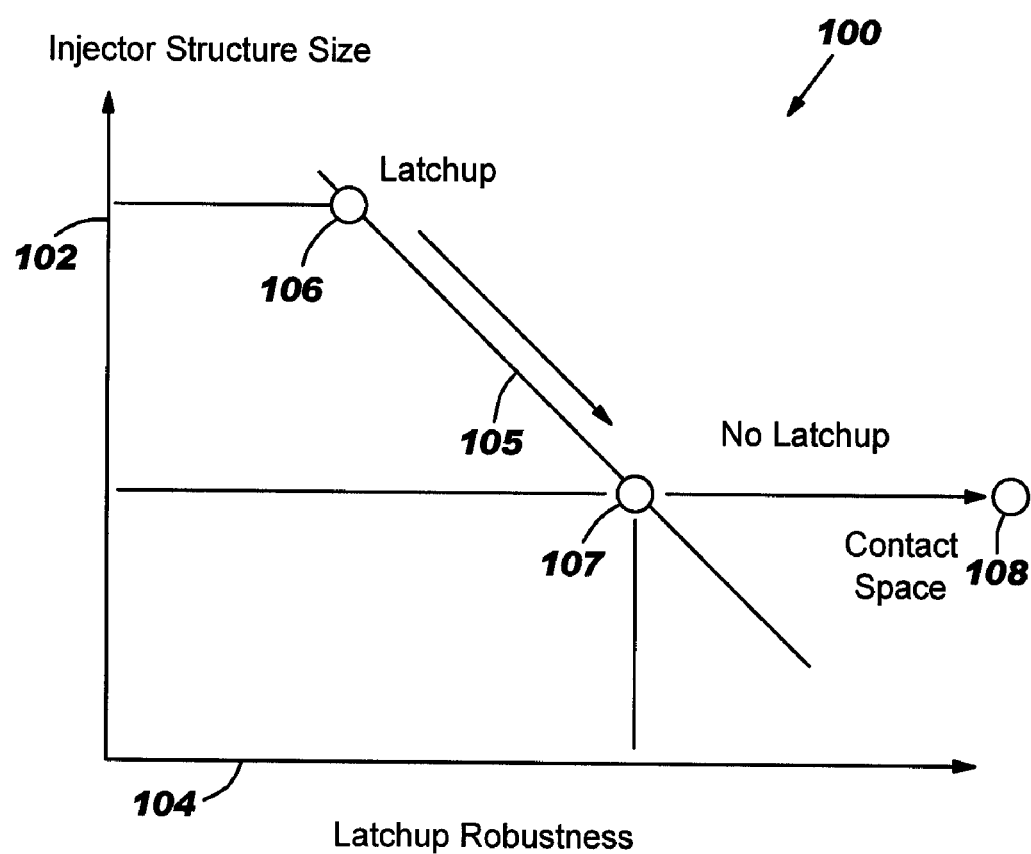
FIGS. 3 and 4 are graphs illustrating modifications and subsequent results of the modifications of parameters of FIG. 2.
Figure 4:
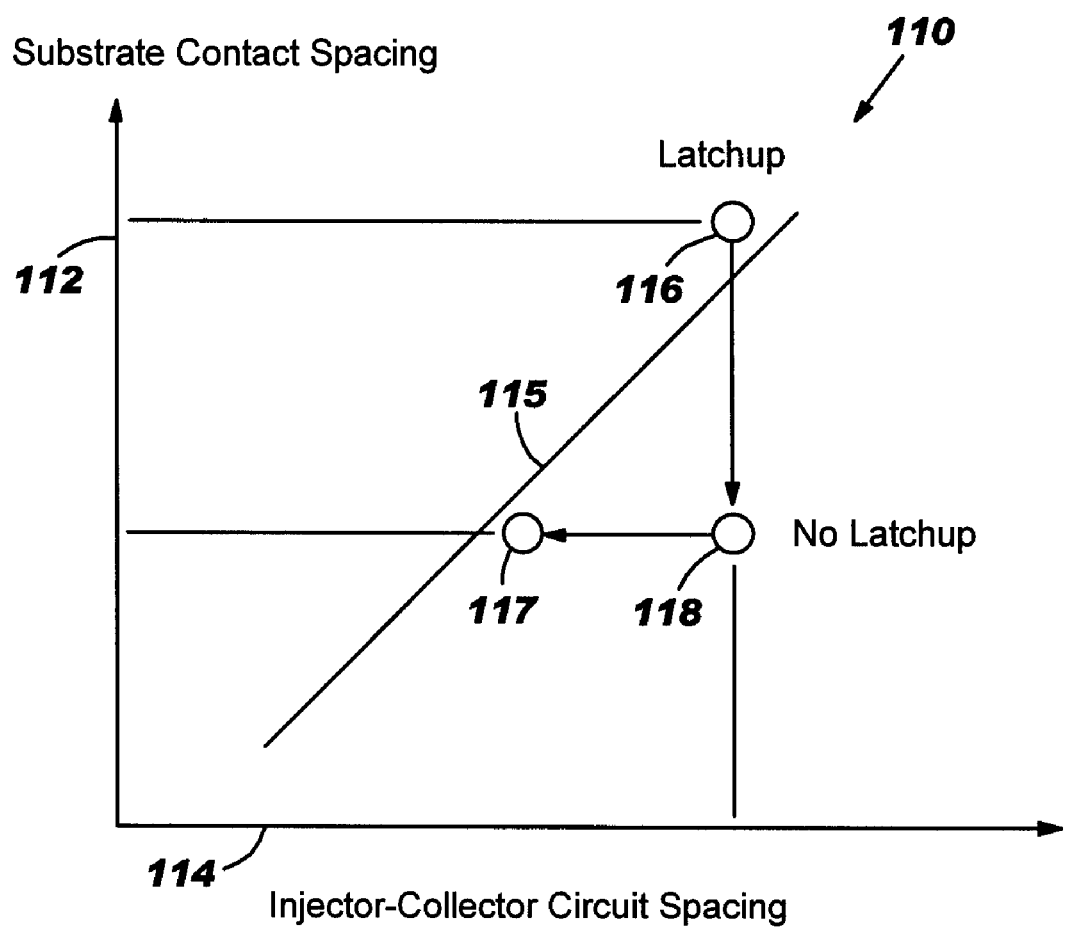

FIGS. 3 and 4 illustrate specific examples of modifying parameters of collector circuit 90 and injector source 92 to determine the latch-up sensitivity of collector circuit 90.

Although specific parameters are modified in this example, it is to be understood that the present invention is not limited to such. Other example parameters that may be modified are discussed in reference to FIGS. 5A, 5B and 5C.

FIG. 3 illustrates a graph 100 with x-axis 104 indicating the latch-up sensitivity, i.e., sensitivity of a circuit to latch-up (indicated as "latch-up robustness," i.e., likelihood of avoiding latch-up, in FIG. 3), of a semiconductor chip containing collector circuit 90 (FIG. 2) and y-axis 102 indicating the structure size of injector source 92 (FIG. 2). Reduction of the size of an injection source, such as injector source 92 (FIG. 2) reduces the probability and risk that collector circuit 92 (FIG. 2) would undergo latch-up from injector source 92 (FIG. 2). As can be seen in this specific graph, the latch-up robustness of collector circuit 90 (FIG. 2) increases as the structure size parameter of injector source 92 (FIG. 2) is decreased from points 106 to 107 along line 105. After the injector structure size reaches point 107, other parameters may be modified, such as the substrate contact spacing 93 (FIG. 2) or the well contact spacing 94 (FIG. 2), which will further increase the inherent latch-up robustness of the collector circuit to point 108.

FIG. 4 illustrates a graph 110 with x-axis 114 indicating the injector source 92 (FIG. 2) to collector circuit 90 (FIG. 2) spacing and y-axis 112 indicating the substrate contact spacing 93 (FIG. 2). As aforementioned, design criteria are important for overall circuit performance. As can be seen in this specific graph, latch-up occurs when the data points are above line 115, and does not occur when the data points are below line 115. Thus, both substrate contact spacing 112 and injector-collector circuit spacing 114 may be manipulated to achieve a desired circuit scheme without latch-up. That is, decreasing substrate contract spacing 112 from point 116 to 118 will prevent latch-up of collector circuit 90 (FIG. 2). In addition thereto, the injector-collector circuit spacing 114 may be reduced from point 118 to point 117 without latch-up of collector circuit 90 (FIG. 2) to improve overall circuit and system performance.

As aforementioned, in our implementation, the substrate contact spacing 93 (FIG. 2) and well contact spacing 94 (FIG. 2) may be a design parameter in the graphical, schematic or symbol cellview in a Cadence design system, or similar design environment. These parameters do not have to be contained within the primitive Pcell or the hierarchical Pcell. If the hierarchical circuit order is increased to include these physical shapes after compiling, these parameters can be auto-modified in the higher order hierarchical Pcell, allowing for personalization, customization and modification of these parameters relative to the input from the injector-collector circuit spacing.

As the injector-collector circuit spacing 114 is decreased, different design parameters and modifications can be established. The parameters can be adjusted inside the Pcell based on the injector-collector spacing 114, the latch-up robustness target or specification, or other criteria. The system can modify a parameter, for example, by adding additional latch-up preventing Pcells, such as latch-up guard ring structures. Latch-up guard rings can themselves be a Pcell with a plurality of consecutive ring types and choices. The latch-up robustness objective may invoke different rings to achieve the latch-up objective.

Figure 5A:
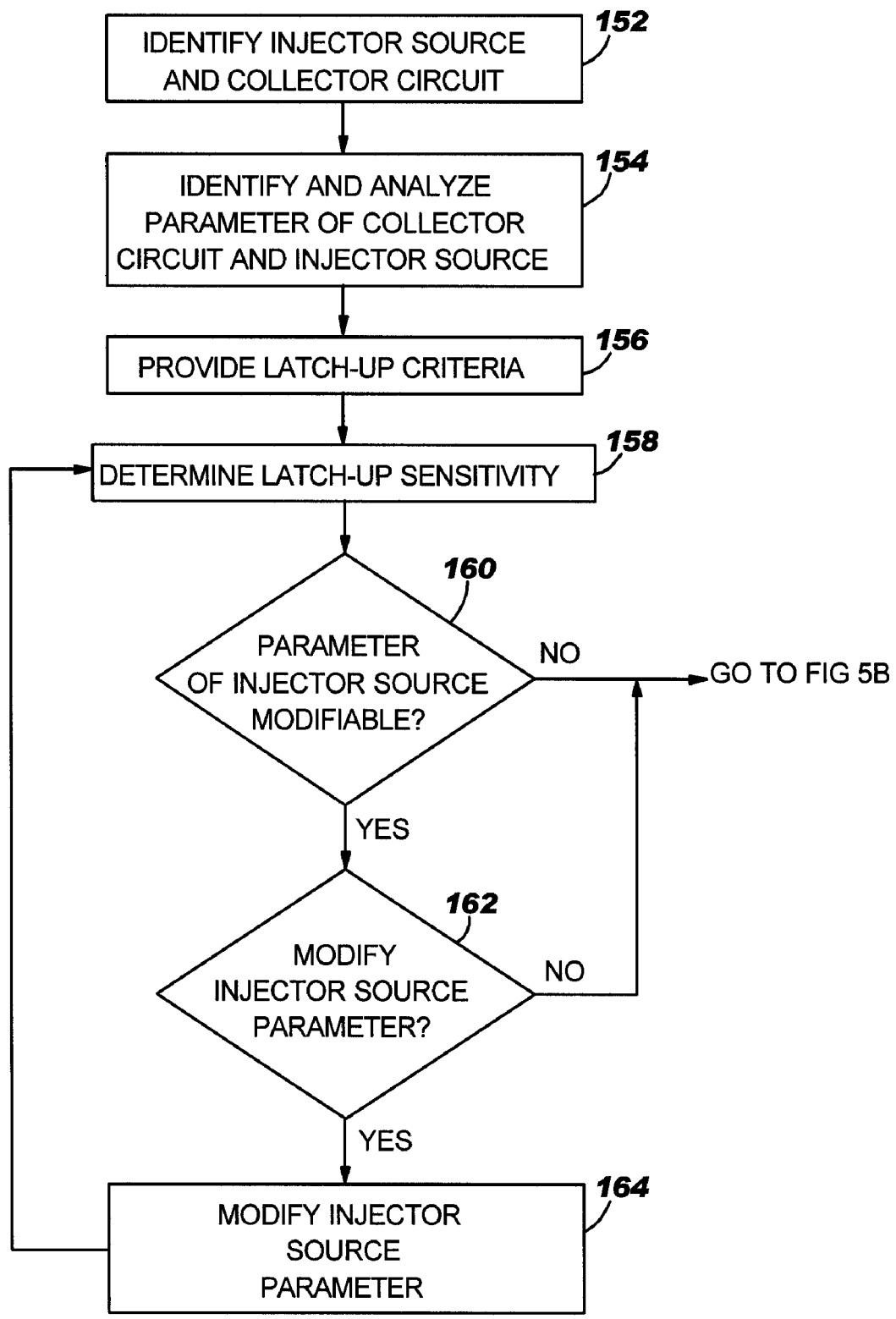
FIGS. 5A, 5B and 5C are a flow diagram illustrating a method in accordance with the present invention.
Figure 5B:
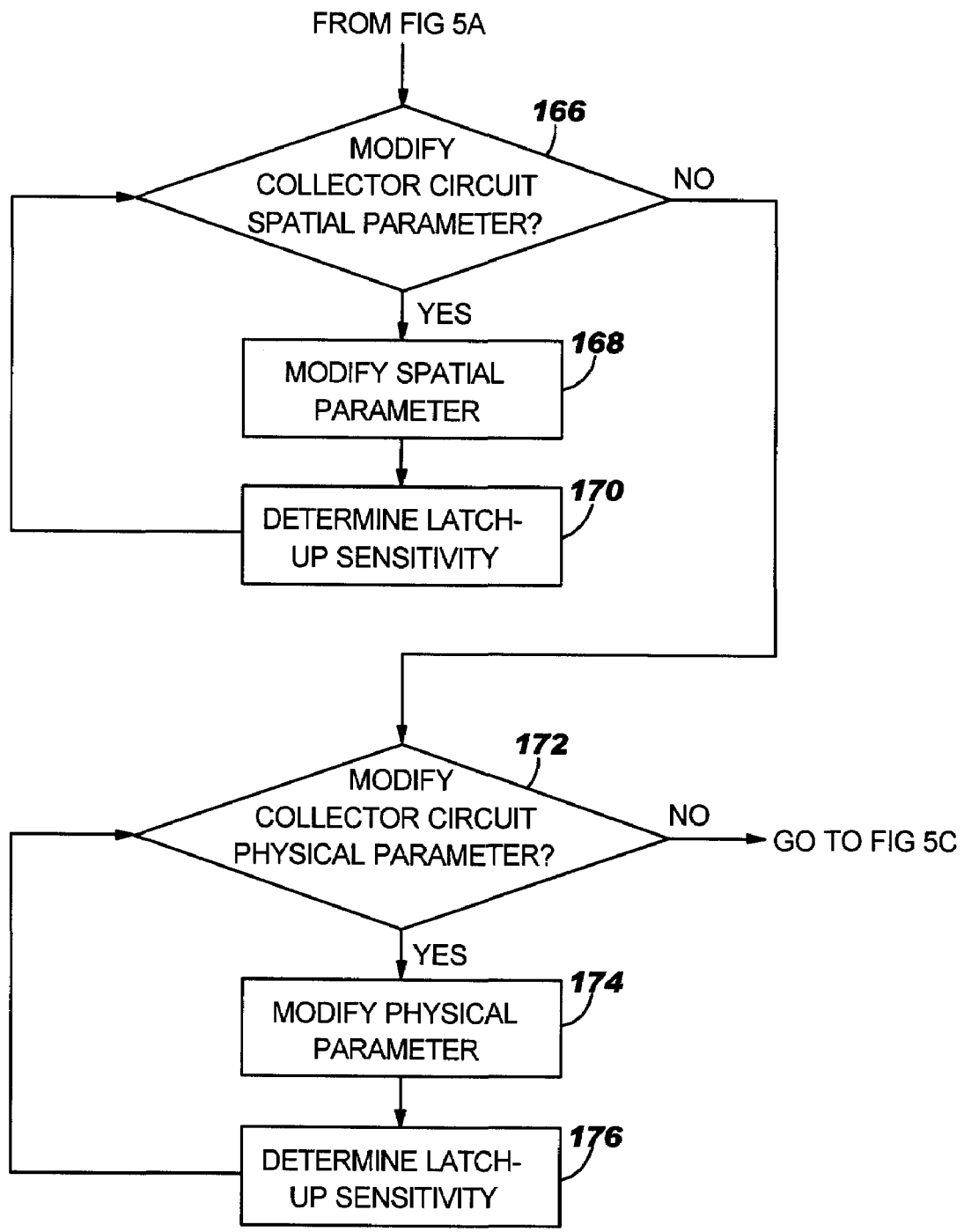
Figure 5C:
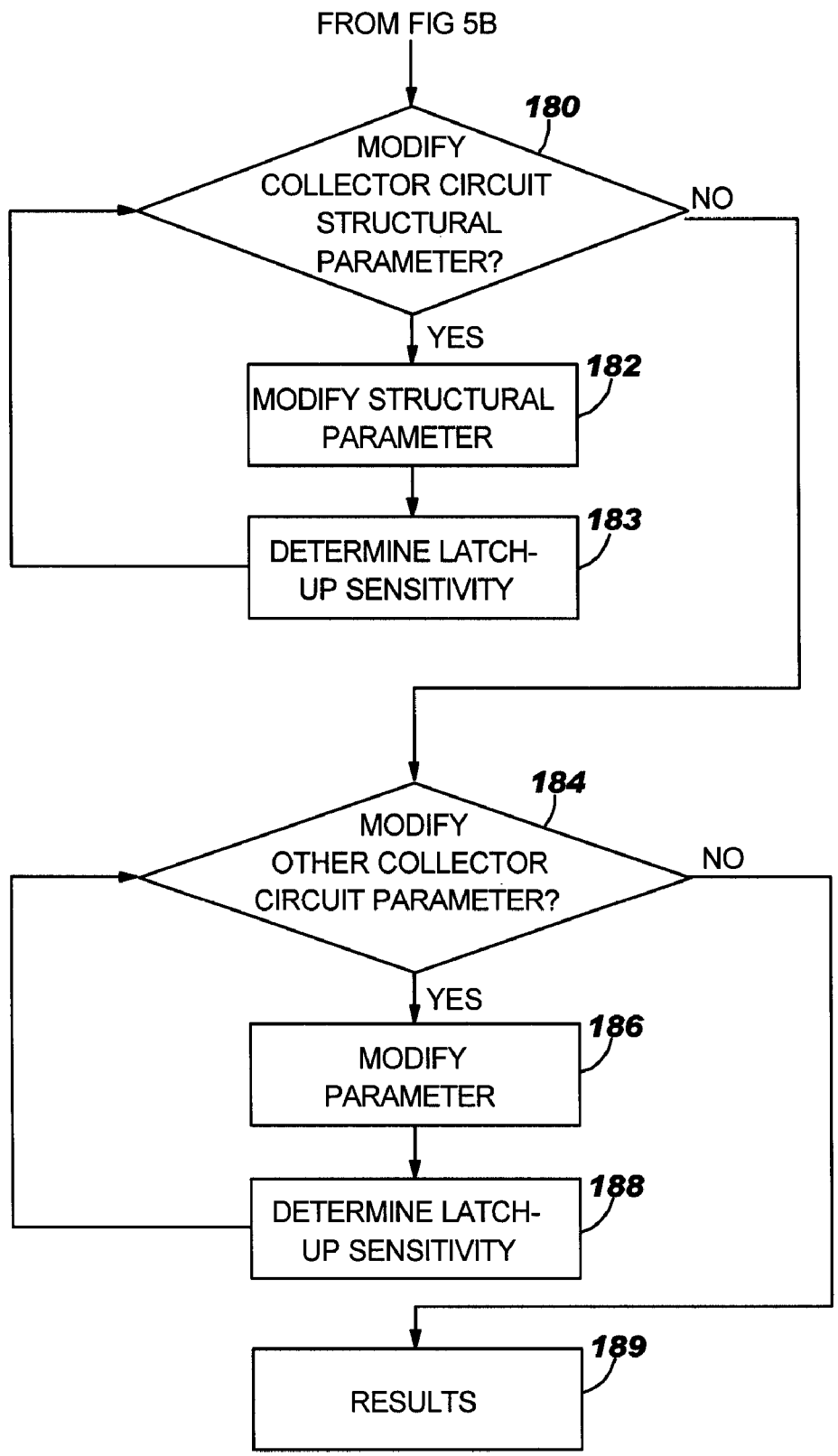

FIGS. 5A, 5B and 5C illustrate a flow diagram illustrating one embodiment of an operational method of system 10 (FIG. 1) in accordance with the present invention. Although the steps shown and discussed below are shown in a specific order for this specific example, it is to be understood that identifying and modifying each parameter of collector circuit 90 (FIG. 2) and injector source 92 (FIG. 2) may be done in several different orders (e.g., modifying a physical parameter first, then a spatial parameter next, or modifying a parameter of the collector circuit first and then a parameter of the injector source, etc.). Accordingly, the invention is not limited to this specific example.

As seen in FIG. 5A, the first step 152 of latch-up analysis and parameter modification system 10 (FIG. 1) includes identifying an injector source, such as injector source 92 (FIG. 2), and a collector circuit, such as collector circuit 90 (FIG. 2), with injector source and collector circuit identifier 24 (FIG. 1). As aforementioned, the design level of injector source 92 (FIG. 2) may be a virtual design level or an actual design level. The design level of collector circuit 90 (FIG. 2) may also be a virtual design level or an actual design level. Injector source 92 (FIG. 2) is a source that may unintentionally activate collector circuit 90 (FIG. 2), resulting in latch-up of collector circuit 90 (FIG. 2). Collector circuit 90 (FIG. 2) includes any circuit that may be affected by injector source (FIG. 2). The identification of injector source 92 (FIG. 2) and collector circuit 90 (FIG. 2) may be done through design system 15 (FIG. 1). One specific example of identifying may be through the Cadence design system, wherein injector source 92 (FIG. 2) and collector circuit 90 (FIG. 2) are identified through Pcells formed from a graphical or schematic approach. For example, since latch-up typically occurs within a pnpn structure, which may be intentionally designed, or unintentionally formed between structures, collector circuit 90 (FIG. 2) is typically a pnpn structure, which may be identified through Pcells.

The next step 154 includes identifying at least one parameter of collector circuit 90 (FIG. 2) and/or injector source 92 (FIG. 2) using injector source and collector circuit parameter identifier 28 (FIG. 1). For example, the parameter of either collector circuit 90 (FIG. 2) and injector source 92 (FIG. 2) may be identified by injector source and collector circuit parameter identifier 28 (FIG. 1) through use of graphical, schematic and symbolic generators 17 (FIG. 1). It should be recognized, however, that this step may be an optional step since the parameter may already be identified or inherent within the identification of collector circuit 90 (FIG. 2) and injector source 92 (FIG. 2) such that active identification may not be needed. A parameter of collector circuit 90 (FIG. 2) may include but is not limited to: a spatial parameter (e.g., the distance between its p+ to n-well space, between its n+ to n-well space, between its n-well contact to p+ space, between its p+ substrate contact to n+ space, and between the collector circuit and the injector source, etc.); a physical parameter (e.g., the topological features, the characteristics of the semiconductor layers, the placement of the wells and contacts, the presence of implants, deep trenches, trench isolation structures, and guard rings, etc.); and a structural parameter (e.g., the placement and presence of transistors, resistor, etc. in the circuit). A parameter of injector source 92 (FIG. 2), if identifiable, may include, but is not limited to: a physical parameter (e.g., the topological features, the characteristics of the semi-conductor layers, the placement of the wells and contacts, etc.); a structural parameter (e.g., the placement and presence of transistors, resistor, etc.); and a spatial parameter (e.g., the distance to the collector circuit).

The third step 156 includes providing or defining latch-up criteria with latch-up identifier 26 (FIG. 1). This step provides the criteria that will cause a latch-up in collector circuit 90 (FIG. 2). Latch-up criteria may be defined through specific design rules, which may be inherent within design system 15 (FIG. 1), provided by system 10 (FIG. 1) or provided through other external sources, such as a separate system or database. As aforementioned, the sensitivity of a particular pnpn structure (i.e., collector circuit 90 (FIG. 2)) to latch-up may be a function of spacings (e.g., the base width of the npn and the base width of the pnp), current gain of the transistors, substrate resistance and spacing, the well resistance and spacings, emitter resistance and isolation regions. Thus, examples of these design rules may include, but are not limited to: rules concerning spacing between injector source 92 (FIG. 2) and collector circuit 90 (FIG. 2); rules concerning spacing between collector circuit 90 (FIG. 2) and substrate contact 96 (FIG. 2); and rules concerning spacing between collector circuit 90 (FIG. 2) and well contact 98 (FIG. 2). In a Cadence design environment (as with a parameter), the latch-up criteria may be contained in Pcells. The latch-up criteria may be inherent in a primitive Pcell, or an inherited parameter of the hierarchical Pcell.

The next step 158 includes determining latch-up sensitivity of collector circuit 90 (FIG. 2) with latch-up analyzer 30 (FIG. 1). This step includes using the parameter identified for collector circuit 90 (FIG. 2) and/or injector source 92 (FIG. 2) and the latch-up criteria to determine if and when latch-up will occur within collector circuit 90 (FIG. 2). For example, for a Cadence design environment, or similar design environment, the Pcell or Pcells of the identified parameter could be evaluated, using latch-up analyzer 30 (FIG. 1), with the Pcells of the latch-up criteria to determine latch-up sensitivity of collector circuit (FIG. 2).

The next steps 160–188 include modifying the parameter of injector source 92 (FIG. 2) and/or collector circuit 90 (FIG. 2) using parameter modification unit 32 (FIG. 1). In addition, the latch-up sensitivity of collector circuit 90 (FIG. 2) may be determined with each modification using latch-up analyzer 30 (FIG. 1). Whether to modify a specific parameter, and how to modify that parameter (e.g., through spatial, physical, and/or structural modifications) may be determined through latch-up criteria and other design rules (including a preference of parameters to be modified), or through user input, or through any other appropriate method or combination of such methods. For example, a preference of how a plurality of parameters may be modified (e.g., first, modify spatial parameters, second, modify physical parameters, and third, modify structural parameters), and other design rules (e.g., spacing requirements between circuit elements, etc.) of collector circuit 90 (FIG. 2) may be stored within system 10 (FIG. 1). Collector circuit 90 (FIG. 2) may then be modified according to the parameter preferences as long as the parameter of collector circuit 90 (FIG. 2) remains within the boundaries of the other design rules and latch-up criteria.

More specifically, as shown in reference to FIG. 4, within the spatial parameters there may be a preference to modify first the substrate contact spacing 112 (FIG. 4), then second, if allowed by the design rules of collector circuit 90 (FIG. 2), the injector-collector circuit spacing 114. A determination may be made of the latch-up sensitivity (robustness) of collector circuit 90 (FIG. 2) by comparing the latch-up criteria to the parameter of collector circuit 90 (FIG. 2) after each of its modifications. As aforementioned, for a Cadence environment, this evaluation may be completed by latch-up analyzer 30 evaluating the Pcells of the latch-up criteria and the Pcell or Pcells of the parameter of collector circuit 90 (FIG. 2).

Collector circuit 90 (FIG. 2) may be modified more than once to alter latch-up sensitivity to achieve a latch-up sensitivity target, which may also be stored within system 10 (FIG. 1). Collector circuit 90 (FIG. 2) may also be modified to improve overall circuit and system performance through, for example, decreasing the size of collector circuit 90 (FIG. 2), without latch-up of collector circuit 90 (FIG. 2). For a Cadence design system, or similar system, the modification of a parameter may be optimized within and between other parameters of collector circuit 90 (FIG. 2) and injector source 92 (FIG. 2) because of the linkage of the Pcells, or similar cells. Also, as aforementioned, it is to be understood that the modification of a plurality of parameters may be done in any order and are not limited to the specific order discussed below.

Step 160 identifies if the parameter of injector source 92 (FIG. 2) is modifiable. In such cases where injector source 92 is an alpha particle, ionizing radiation, cosmic ray, or similar source, the parameter is not modifiable (i.e., NO), and the next step is step 166 in FIG. 5B. This determination may be made in a variety of ways depending on the design system. For example, in a Cadence design system, or similar system, the Pcells, or absence of Pcells, will indicate whether injector source 92 (FIG. 2) is modifiable. If the injector source is modifiable, then step 162 determines whether to modify the injector source parameter, as explained above. If NO, the next step is step 166 in FIG. 5B. If YES, the injector source parameter is modified in step 164, and the latch-up sensitivity is determined again in step 158. Some examples of modification of the parameter of the injector source include, but are not limited to: reducing the size of the injector source, and/or the placement of the injector source with respect to the collector circuit.

Referring to FIG. 5B (from FIG. 5A), step 166 determines whether to modify a collector circuit spatial parameter, as explained above. If NO, the next step will be step 172. If YES, the spatial parameter is modified in step 168. Modifications of the spatial parameter include, but are not limited to: increasing the p+ to n-well space; increasing the n+ to n-well space; changing the n-well contact to p+ space; and changing the p+ substrate contact to n+ space. The latch-up sensitivity of collector circuit 90 (FIG. 2) is determined in step 170, which is similar to the determining of the latch-up sensitivity in step 158 (FIG. 5A), and the flow returns to step 166 to decide whether to further modify a spatial parameter.

Step 172 determines whether to modify a collector circuit physical parameter, as explained above. If NO, the next step will be step 180 in FIG. 2C. If YES, the physical parameter of the collector circuit is modified in step 174. Modifications of the physical parameter include, but are not limited to: adding sub-collector implants; adding deep trench (DT) or trench isolation (TI) structures perimeters; and/or adding latch-up guard rings (e.g., p+, n+, n-well, DT, or TI). For example, in a Cadence design system, modifications can be initiated wherein the parameter is inherent in a primitive Pcell, or an inherited parameter of the hierarchical Pcell. Additionally, the features can be implemented by forming a new higher-order hierarchical Pcell to the existing hierarchical Pcell by auto-generating and compiling a new Pcell with the physical parameter of interest. The latch-up sensitivity of collector circuit 90 (FIG. 2) is determined in step 176, which is similar to the determining of the latch-up sensitivity in step 158 (FIG. 5A), and the flow returns to step 172 to decide whether to further modify a physical parameter.

Referring to FIG. 5C (from FIG. 5B), step 180 determines whether to modify a collector circuit structural parameter, as explained above. If NO, the next step will be step 184. If YES, the structural parameter is modified in step 182. Modifications of the structural parameter include, but are not limited to: adding transistors; removing transistors; and/or reducing circuit elements. In one example, in a Cadence design environment, this step may add or delete Pcells or modify the hierarchical structure of an existing Pcell. The latch-up sensitivity of collector circuit 90 (FIG. 2) is determined in step 183, which is similar to the determining of the latch-up sensitivity in step 158 (FIG. 5A), and the flow returns to step 180 to decide whether to further modify a structural parameter.

Step 184 determines whether to modify any other collector circuit parameter, as explained above. If NO, the next step is step 189, which displays the results of the collector circuit 90 (FIG. 2) and injector source 92 (FIG. 2) and the latch-up evaluation. If further modification is determined (i.e., YES), whether it be physical, spatial, structural, etc., the determined parameter may be modified in step 186. The latch-up sensitivity of collector circuit 90 (FIG. 2) is determined in step 188, which is similar to the determining of the latch-up sensitivity in step 158 (FIG. 5A) and the flow returns to step 184 to decide whether to further modify a collector circuit parameter.

In the previous discussion, it will be understood that the method steps discussed in reference to FIGS. 5A, 5B, and 5C are performed by a processor, such as CPU 14 of system 10 (FIG. 1), executing instructions of program product 22 (FIG. 1) stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

The above-described invention, as seen in the previous examples, provides a latch-up analysis and parameter modification system, program product and method that analyzes a circuit design for latch-up sensitivity and allows for modifications of the circuit design to avoid latch-up of the circuit while improving the density and overall performance of the circuit.

While this invention has been described in conjunction with the specific embodiment outlined above, it is evident that many alternatives, modifications and variations will be apparent to those skilled in the art. Accordingly, the embodiment of the invention as set forth above is intended to be illustrative, not limiting. Various changes may be made without departing from the spirit and scope of the invention as defined in the following claims.

What is claimed is:

1. A method comprising the steps of:
   a. identifying an injector source and a collector circuit, at least one of the injector source and the collector circuit having a parameter, wherein the injector source is a source that unintentionally activates the collector circuit, resulting in latch-up of the collector circuit;
   b. providing latch-up criteria for the collector circuit;
   c. determining latch-up sensitivity of the collector circuit based on the latch-up criteria and the parameter;
   d. modifying the parameter to adjust the latch-up sensitivity of the collector circuit; and
   e. determining the latch-up sensitivity of the collector circuit based on the latch-up criteria and the modified parameter.

2. The method of claim 1, wherein step a) further comprises the step of identifying the parameter as at least one of a physical, structural and spatial parameter.

3. The method of claim 2, further comprising the step of identifying the parameter through at least one of a schematic generator, a graphical generator and a symbol generator.

4. The method of claim 1, wherein step d) further comprises the step of modifying the parameter with a graphical user interface.

5. The method of claim 1, wherein step d) further comprises the step of modifying the physical size of the injector source.

6. The method of claim 1, wherein step a) further comprises the step of identifying the parameter through at least one parameterized cell.

7. A computer program product comprising a computer useable medium having computer readable program code embodied therein for analyzing and modifying latch-up sensitivity of a circuit design, the program product comprising:
   program code configured to identify an injector source and a collector circuit, at least one of the injector source and the collector circuit having a parameter, wherein the injector source is a source that unintentionally activates the collector circuit, resulting in latch-up of the collector circuit;
   program code configured to determine latch-up sensitivity of the collector circuit based on a latch-up criteria and the parameter; and
   program code configured to modify the parameter to adjust the latch-up sensitivity of the collector,
   wherein the determining program code is also configured to determine the latch-up sensitivity of the collector circuit based on the latch-up criteria and the modified parameter.

8. The program product of claim 7, wherein the identifying program code identifies the parameter as at least one of a physical, structural and spatial parameter.

9. The program product of claim 8, wherein the identifying program code includes at least one of a schematic generator, a graphical generator and a symbol generator.

10. The program product of claim 9, wherein the identifying program code further comprises program code configured to identify the parameter through at least one parameterized cell.

11. The program product of claim 7, wherein the parameter is modified with a graphical user interface.

12. The program product of claim 7, wherein the modifying program code further comprises program code configured to modify a physical size of the injector source.

13. A latch-up analysis and parameter modification system comprising:
- an injector source and collector circuit identifier that identifies an injector source and a collector circuit, at least one of the injector source and the collector circuit having a parameter, wherein the injector source is a source that unintentionally activates the collector circuit, resulting in latch-up of the collector circuit;
- a latch-up identifier providing latch-up criteria for the collector circuit;
- a parameter modification unit to modify the parameter; and
- a latch-up analyzer that determines latch-up sensitivity of the collector circuit based on the latch-up criteria of the latch-up identifier and at least one of the parameter and the modified parameter.

14. The system of claim 13, further comprising an injector source and collector circuit parameter identifier that identifies the parameter as at least one of a physical, structural and spatial parameter.

15. The system of claim 14, wherein the injector source and collector circuit parameter identifier comprises at least one of a schematic generator, a graphical generator and a symbol generator.

16. The system of claim 15, wherein the at least one of a schematic generator, a graphical generator and a symbol generator comprises at least one parameterized cell.

17. The system of claim 13, wherein the parameter modification unit includes a graphical user interface.

* * * * *